US012495514B2

(12) United States Patent
Su

(10) Patent No.: US 12,495,514 B2
(45) Date of Patent: Dec. 9, 2025

(54) FAN ASSEMBLY AND ELECTRONIC DEVICE

(71) Applicant: Nanning FuLian FuGui Precision Industrial Co., Ltd., Nanning (CN)

(72) Inventor: Ying-Feng Su, New Taipei (TW)

(73) Assignee: Nanning FuLian FuGui Precision Industrial Co., Ltd., Nanning (CN)

(*) Notice: Subject to any disclaimer, the term of this patent is extended or adjusted under 35 U.S.C. 154(b) by 304 days.

(21) Appl. No.: 18/384,526

(22) Filed: Oct. 27, 2023

(65) Prior Publication Data

US 2025/0142766 A1 May 1, 2025

(51) Int. Cl.
*H05K 7/20* (2006.01)
*F04D 29/60* (2006.01)
*F04D 29/64* (2006.01)
*F04D 19/00* (2006.01)

(52) U.S. Cl.
CPC ....... *H05K 7/20172* (2013.01); *F04D 29/601* (2013.01); *F04D 29/644* (2013.01); *H05K 7/20727* (2013.01); *F04D 19/002* (2013.01)

(58) Field of Classification Search
CPC .... F04D 29/601; F04D 29/644; F04D 29/646; F05D 2230/51; F05D 2260/36; H05K 7/20172; H05K 7/20727
See application file for complete search history.

(56) References Cited

U.S. PATENT DOCUMENTS

| 6,714,411 | B2* | 3/2004 | Thompson | H05K 7/20581 |
| | | | | 165/122 |
| 7,558,061 | B2* | 7/2009 | Franz | F04D 29/646 |
| | | | | 415/213.1 |
| 9,414,518 | B2* | 8/2016 | Peng | H05K 7/20718 |
| 9,769,958 | B2* | 9/2017 | Jaskela | H05K 7/20718 |
| 10,362,708 | B2* | 7/2019 | Ehlen | H05K 7/1489 |
| 10,729,037 | B1* | 7/2020 | Shearman | H04Q 1/035 |
| 2009/0147452 | A1* | 6/2009 | Zhang | G06F 1/20 |
| | | | | 361/679.02 |
| 2013/0058781 | A1* | 3/2013 | Fu | H05K 7/20581 |
| | | | | 415/220 |
| 2014/0003010 | A1* | 1/2014 | Lee | H05K 7/1485 |
| | | | | 361/759 |
| 2015/0146381 | A1* | 5/2015 | Huang | H05K 7/20172 |
| | | | | 361/727 |

(Continued)

FOREIGN PATENT DOCUMENTS

| CN | 102541220 A | 7/2012 |
| TW | M640397 U | 5/2023 |

*Primary Examiner* — Brian P Wolcott
(74) *Attorney, Agent, or Firm* — ScienBiziP, P.C.

(57) ABSTRACT

A fan assembly and an electronic device are provided in the present disclosure. The electronic device comprises a housing and the fan assembly mounted in the housing. The housing is provided with a receiving chamber, a first opening, and a second opening. The fan assembly includes a plurality of brackets, a fan unit, and a plurality of locking mechanisms. The fan unit includes a mounting plate and a plurality of fan sections. The fan unit may be fitted in the receiving chamber in a forward state or a backward state, to achieve a forward airflow or a backward airflow. Each of the plurality of fan sections may be locked to each bracket by each locking mechanism and be taken out from the receiving chamber with a corresponding bracket.

18 Claims, 12 Drawing Sheets

(56) References Cited

U.S. PATENT DOCUMENTS

2015/0173240 A1    6/2015   Peng et al.
2017/0086332 A1    3/2017   Jaskela et al.
2024/0114648 A1*   4/2024   Yu ...................... H05K 7/20727
2024/0175448 A1*   5/2024   Aoi ...................... F04D 29/522

* cited by examiner

FAN ASSEMBLY AND ELECTRONIC DEVICE

FIELD

The disclosure relates to a fan assembly and an electronic device.

BACKGROUND

In the prior art, a common method for achieving bidirectional airflow heat dissipation for electronic devices is to additionally configure a fan unit that achieves reverse airflow. When reverse airflow is required, a fan unit that achieves forward airflow is removed and replaced with the fan unit that achieves reverse airflow. This requires additional configuration costs and the efficiency of replacing fan unit is low.

SUMMARY OF THE INVENTION

The disclosure is to provide a fan assembly and an electronic device.

In a first aspect, the disclosure provides a fan assembly for mounting in a housing of an electronic device, the housing is provided with a receiving chamber, a first opening, and a second opening, the first opening is oriented towards a first direction, the second opening is oriented towards a second direction, the first opening is communicated to the receiving chamber, the second opening is communicated to the receiving chamber, the first direction is perpendicular to the second direction, the fan assembly comprising:
a plurality of brackets, wherein the plurality of brackets is spaced in a third direction, the third direction is perpendicular to the first direction and the second direction, each of the plurality of brackets is slidably connected to the housing along the second direction and each of the plurality of brackets is configured to slide in or out of the receiving chamber through the second opening, each of the plurality of brackets is provided with a fan mounting chamber, the fan mounting chamber is oriented towards the first opening;
a fan unit comprising a mounting plate and a plurality of fan sections, wherein the mounting plate is removably connected to the housing and the mounting plate covers the first opening, the plurality of fan sections is spaced from each other along the third direction and each of the plurality of fan sections is slidably connected to the mounting plate along the second direction, each of the plurality of fan sections is received in a corresponding fan mounting chamber along the first direction, and has an air inlet and an air outlet opposite the air inlet along the second direction, the fan unit is configured for being rotated integrally to switch between a first state and a second state, in the first state, the air inlet is faced towards the second opening, and in the second state, the air outlet is faced towards the second opening; and
a plurality of locking mechanisms, wherein each of the plurality of locking mechanisms is configured for locking each of the plurality of fan sections to a corresponding bracket, each of the plurality of fan sections locked to each of the plurality of brackets is slidable out of the receiving chamber with the corresponding bracket, and each of the plurality of fan sections sliding out of the receiving chamber with the corresponding bracket is configured for being taken away from the corresponding brackets after each of the plurality of fan sections is unlocked and the fan section unlocked is switchable to the first state or the second state.

In a second aspect, the disclosure provides an electronic device, comprising:
a housing, wherein the housing has a receiving chamber, a first opening, and a second opening, the first opening is oriented towards a first direction, the second opening is oriented towards a second direction, the first opening is communicated to the receiving chamber, the second opening is communicated to the receiving chamber, the first direction is perpendicular to the second direction; and
a fan assembly mounted in the housing comprising:
a plurality of brackets, wherein the plurality of brackets is spaced in a third direction, the third direction is perpendicular to the first direction and the second direction, each of the plurality of brackets is slidably connected to the housing along the second direction and each of the plurality of brackets is configured to slide in or out of the receiving chamber through the second opening, each of the plurality of brackets is provided with a fan mounting chamber, the fan mounting chamber is oriented towards the first opening;
a fan unit comprising a mounting plate and a plurality of fan sections, wherein the mounting plate is removably connected to the housing and the mounting plate covers the first opening, the plurality of fan sections is spaced from each other along the third direction and each of the plurality of fan sections is slidably connected to the mounting plate along the second direction, each of the plurality of fan sections is received in a corresponding fan mounting chamber along the first direction, and has an air inlet and an air outlet opposite the air inlet along the second direction, the fan unit is configured for being rotated integrally to switch between a first state and a second state, in the first state, the air inlet is faced towards the second opening, and in the second state, the air outlet is faced towards the second opening; and
a plurality of locking mechanisms, wherein each of the plurality of locking mechanisms is configured for locking each of the plurality of fan sections to a corresponding bracket, each of the plurality of fan sections locked to each of the plurality of brackets is slidable out of the receiving chamber with the corresponding bracket, and each of the plurality of fan sections sliding out of the receiving chamber with the corresponding bracket is configured for being taken away from the corresponding brackets after each of the plurality of fan sections is unlocked and the fan section unlocked is switchable to the first state or the second state.

The electronic device in the present disclosure only needs to be configured with one fan unit to realize the cooling of bidirectional airflow, which reduces the material management requirements and the occupation of material storage space. Moreover, for the electronic device, the direction of the airflow of the entire fan unit can be easily changed as a whole, and each of the plurality of fan sections can easily be removed and replaced, which is simple in structure and easy to use.

DETAILED DESCRIPTION

The technical scheme in the embodiment of the disclosure will be described in combination with the attached drawings in the embodiment of the application. Obviously, the described embodiments are only part of the embodiments of the application, not all embodiments.

It should be noted that when an element is said to be "fixed to" another element, it can be directly on another element or there can be an intervening element. When a component is "connected" to another component, it can be directly connected to another component or there may be intermediate components at the same time. When a component is "set on" another component, it can be set directly on another component or there may be intervening components at the same time. The terms "vertical," "horizontal," "left," "right," and similar expressions used in this paper are for illustrative purposes only.

Unless otherwise defined, all technical and scientific terms used herein have the same meanings as those commonly understood by those skilled in the technical field of the application. The terms used in the specification of the application herein are only for the purpose of describing specific embodiments and are not intended to limit the application. The term "and/or" as used herein includes any and all combinations of one or more related listed items.

Some embodiments of the disclosure are described in detail. Without conflict, the following embodiments and features in the embodiments can be combined with each other.

FIGS. 1-12 illustrate an electronic device 100 of an embodiment of the disclosure, the electronic device 100 comprises a housing 11 and a fan assembly 10 mounted to the housing 11, the fan assembly 10 is used to dissipate heat for the electronic device 100.

The electronic device 100 may be a switch, a server, etc., and some of its internal electronic elements, for example a motherboard, a hard disk, etc., will generate heat during operation. The fan assembly 10 can dissipate heat for the electronic device 100 to ensure stable and long-lasting operation of the electronic device 100.

Figure 1:
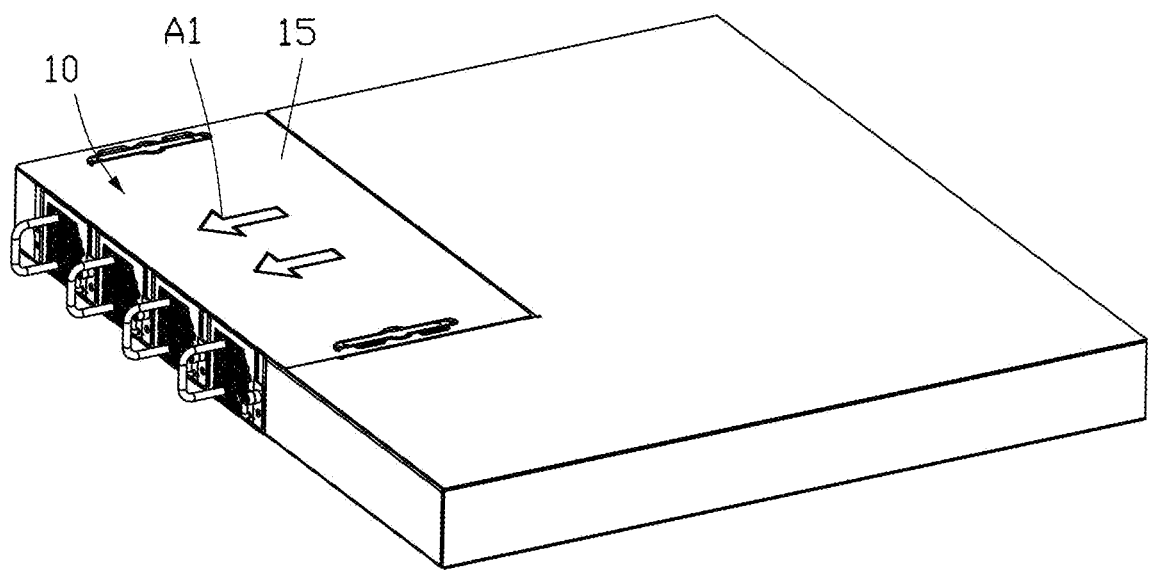
FIG. 1 is a three-dimensional view illustrating an electronic device according to an embodiment of the present disclosure.
Figure 2:
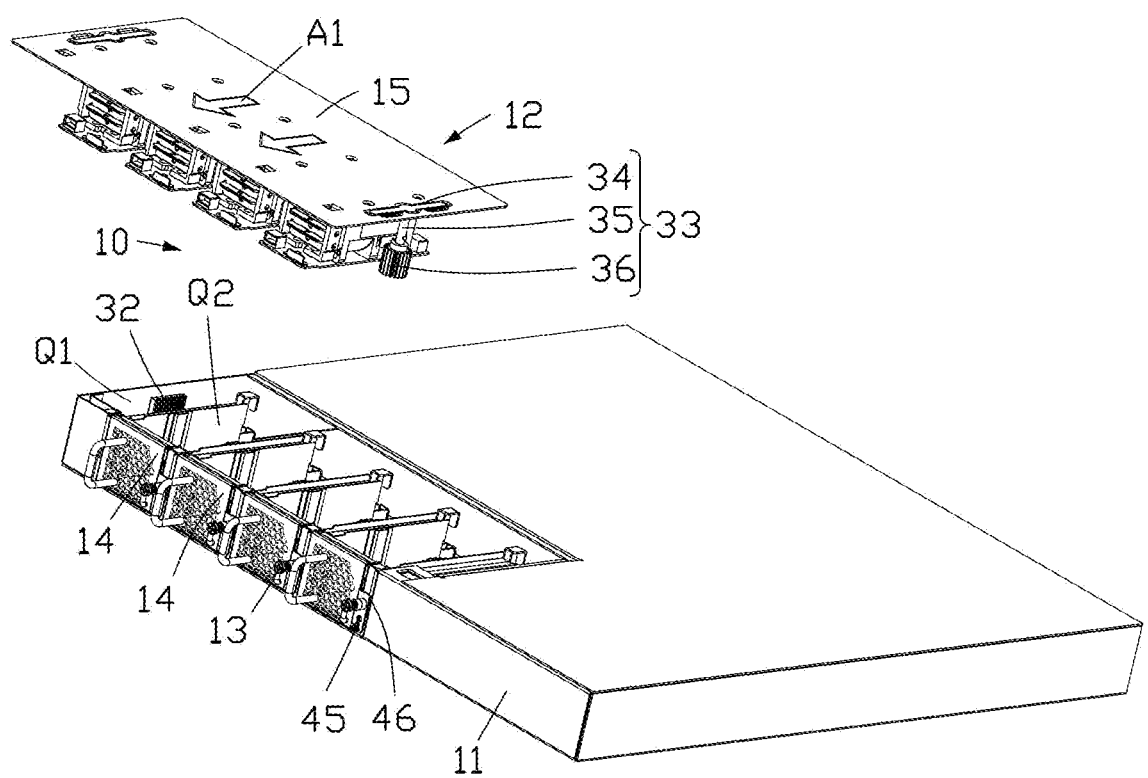
FIG. 2 is an exploded view illustrating the electronic device in FIG. 1.
Figure 3:
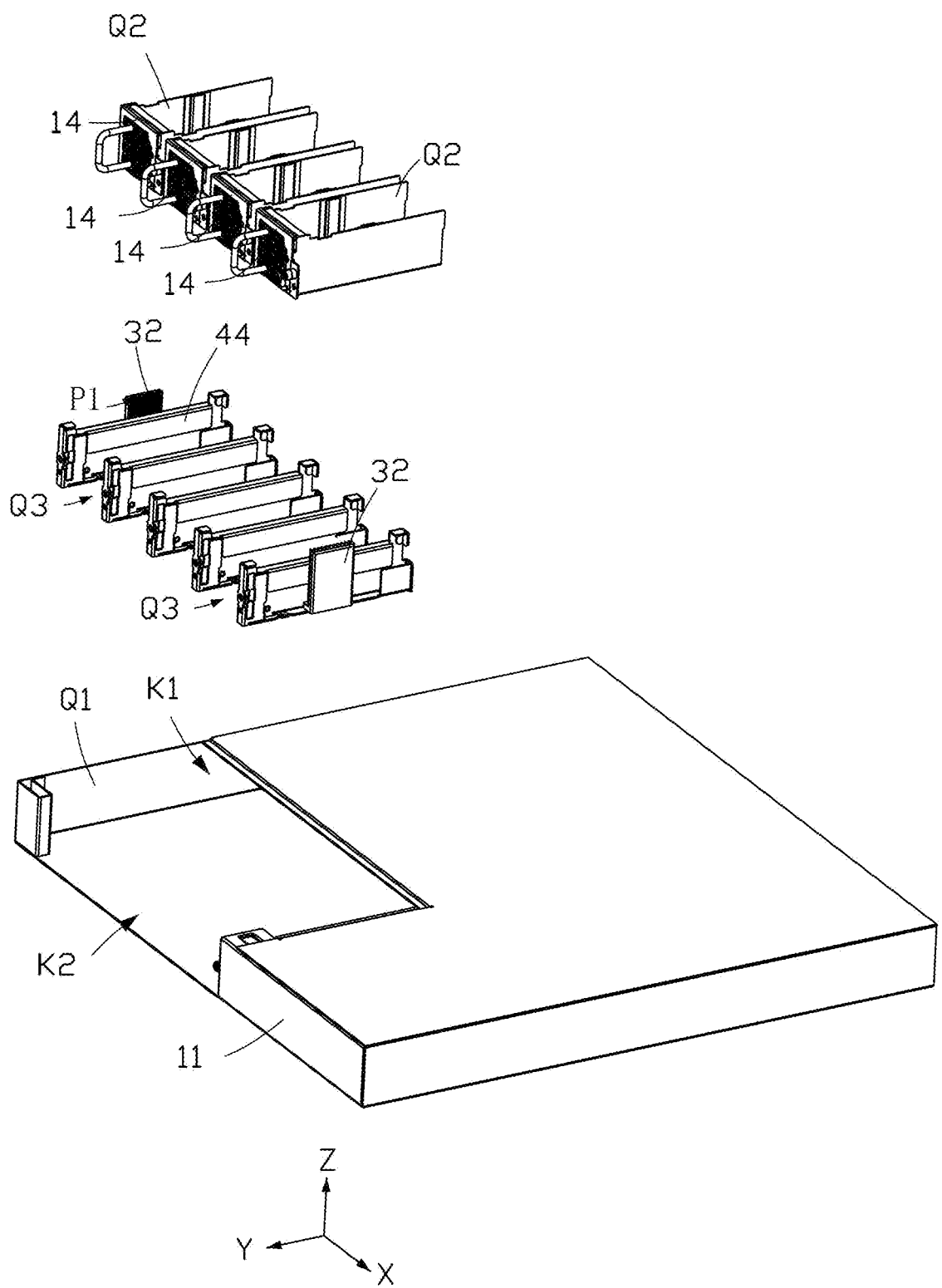
FIG. 3 is an exploded view illustrating the electronic device in FIG. 1 without showing a fan unit.

Referring to FIGS. 1-3, the fan assembly 10 includes a fan unit 12, a locking mechanism 13, and a plurality of brackets 14. Other electronic elements, for example a motherboard, a hard disk, etc., within the electronic device 100 may be provided in a space inside the housing 11 outside of the fan assembly 10. Wherein, the number of locking mechanisms 13 may be the same as the number of brackets 14, for example, each of the locking mechanisms 13 is provided on each of the brackets 14.

It should be noted that the fan unit 12 is not shown in FIG. 3.

The housing 11 defines a receiving chamber Q1, and a portion of the receiving chamber Q1 is mainly used for mounting the fan unit 12 and the brackets 14, and the other portion is used for holding other electronic elements, for example a motherboard, a hard disk, etc., of the electronic device 100.

The housing 11 is provided with a first opening K1 facing towards a first direction Z and a second opening K2 facing towards a second direction Y. The first opening K1 and the second opening K2 are each communicated to the receiving chamber Q1, the first direction Z is perpendicular to the second direction Y. The housing 11 in the present embodiment is substantially in the form of an elongate rectangular box comprising six panels, with the first opening K1 and the second opening K2 being opened in two adjacent panels of the six panels respectively. As shown in FIG. 3, the first opening K1 is provided on a top panel of the box, the second opening K2 is provided on a side panel of the box, and the second opening K2 is communicated to the first opening K1, as illustrated in FIG. 3. The first opening K1 and the second opening K2 are extended to a same side of the box.

The plurality of brackets 14 is spaced from each other along the third direction X, the third direction X is perpendicular to the first direction Z and the second direction Y. The plurality of brackets 14 is each slidably fitted to the housing 11 along the second direction Y and are capable of sliding in or out of the receiving chamber Q1 from the second opening K2. Optionally, a plurality of partition plates 44 is provided within the receiving chamber Q1, the plurality of partition plates 44 is spaced from each other along the third direction X. The plurality of partition plates 44 is each connected to the housing 11, and a slide space Q3 is defined between two adjacent partition plates 44. Each of the plurality of brackets 14 is slidably disposed in each of the plurality of slide spaces Q3 along the second direction Y, each of the plurality of brackets 14 is capable of being independently mounted in or slide out of the slide space Q3. For example, as illustrated in FIG. 3, there are five partition plates 44, four slide spaces Q3 are defined between the five partition plates 44, and each of the four brackets 14 are disposed in each of the four slide spaces Q3.

When the fan assembly is assembled, each partition plate 44 can be fitted into the receiving chamber Q1 from the first opening K1 and secured to the housing 11, and then each bracket 14 can be fitted sequentially into each slide space Q3, and then the fan unit 12 can be assembled so that the fan unit 12 covers the first opening K1 and partially fits within the brackets 14.

Figure 4:
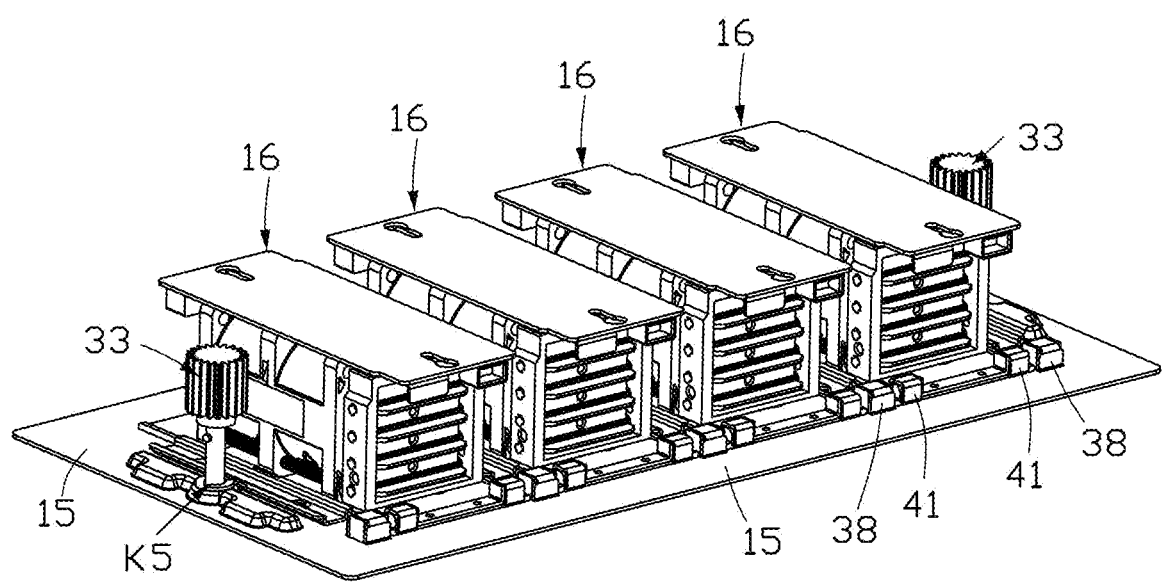
FIG. 4 is a three-dimensional view illustrating a fan unit in FIG. 2.
Figure 5:
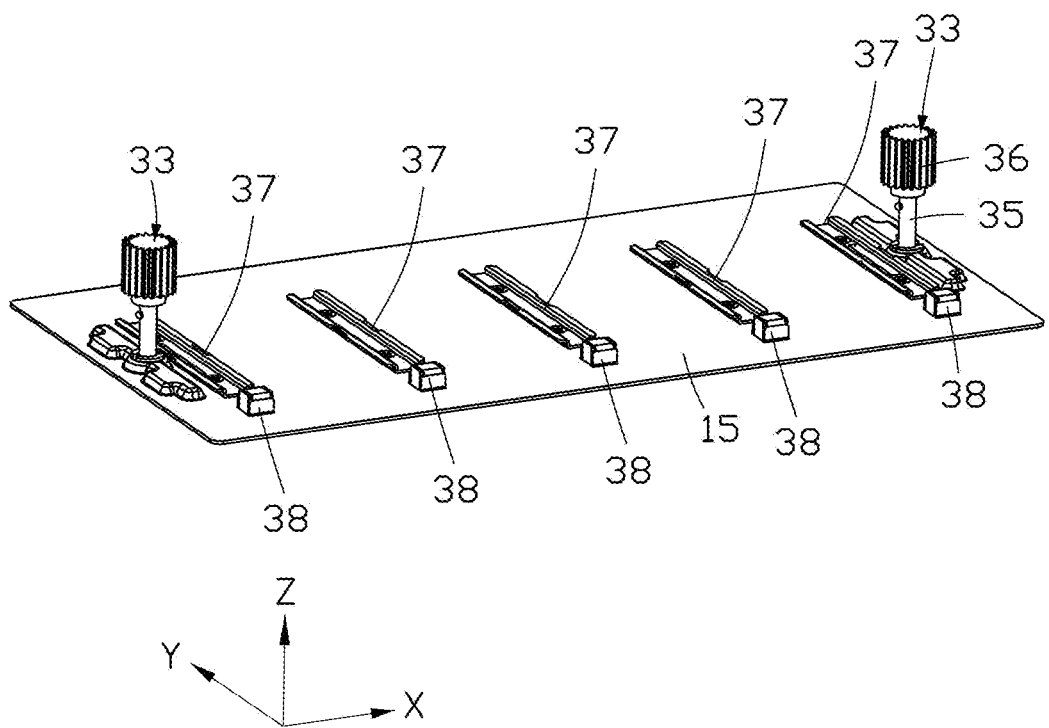
FIG. 5 is a three-dimensional view illustrating a portion of the fan unit in FIG. 4.
Figure 6:
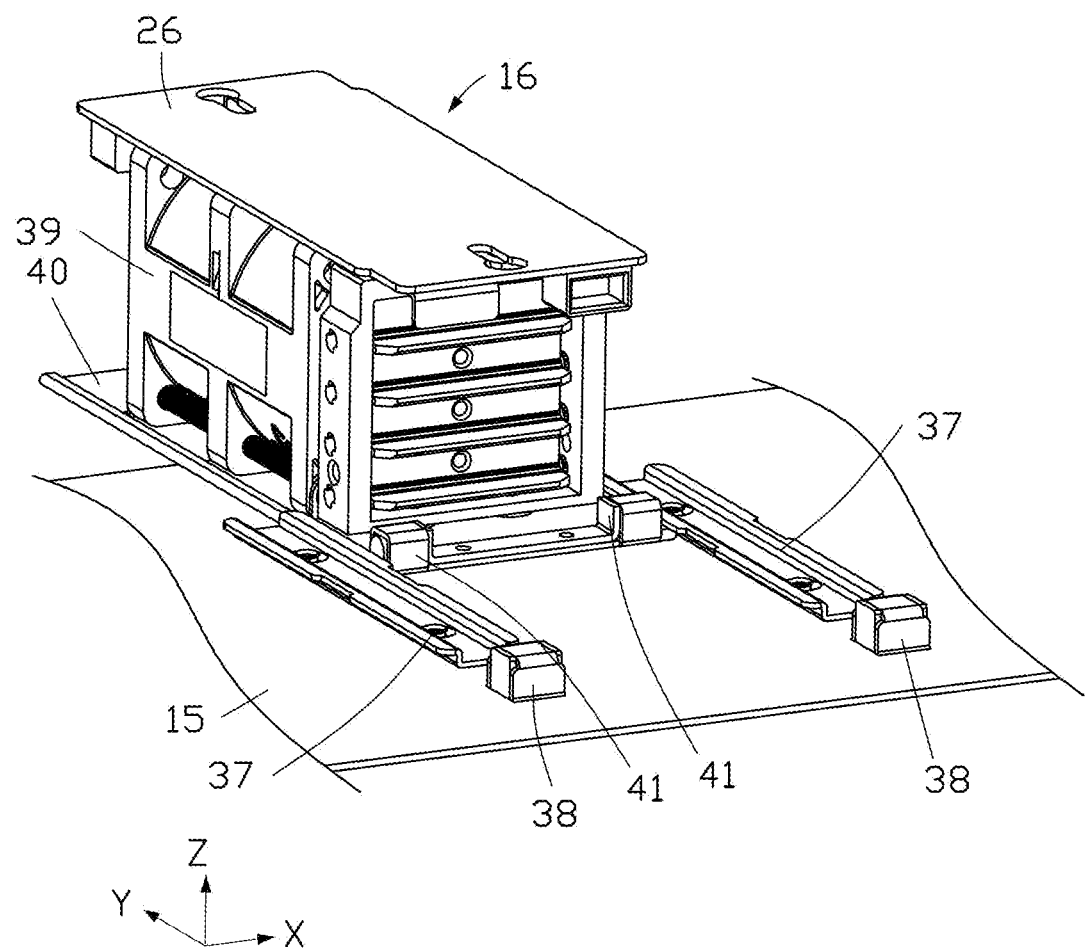
FIG. 6 is an enlarged view illustrating a portion of the fan unit in FIG. 4.
Figure 7:
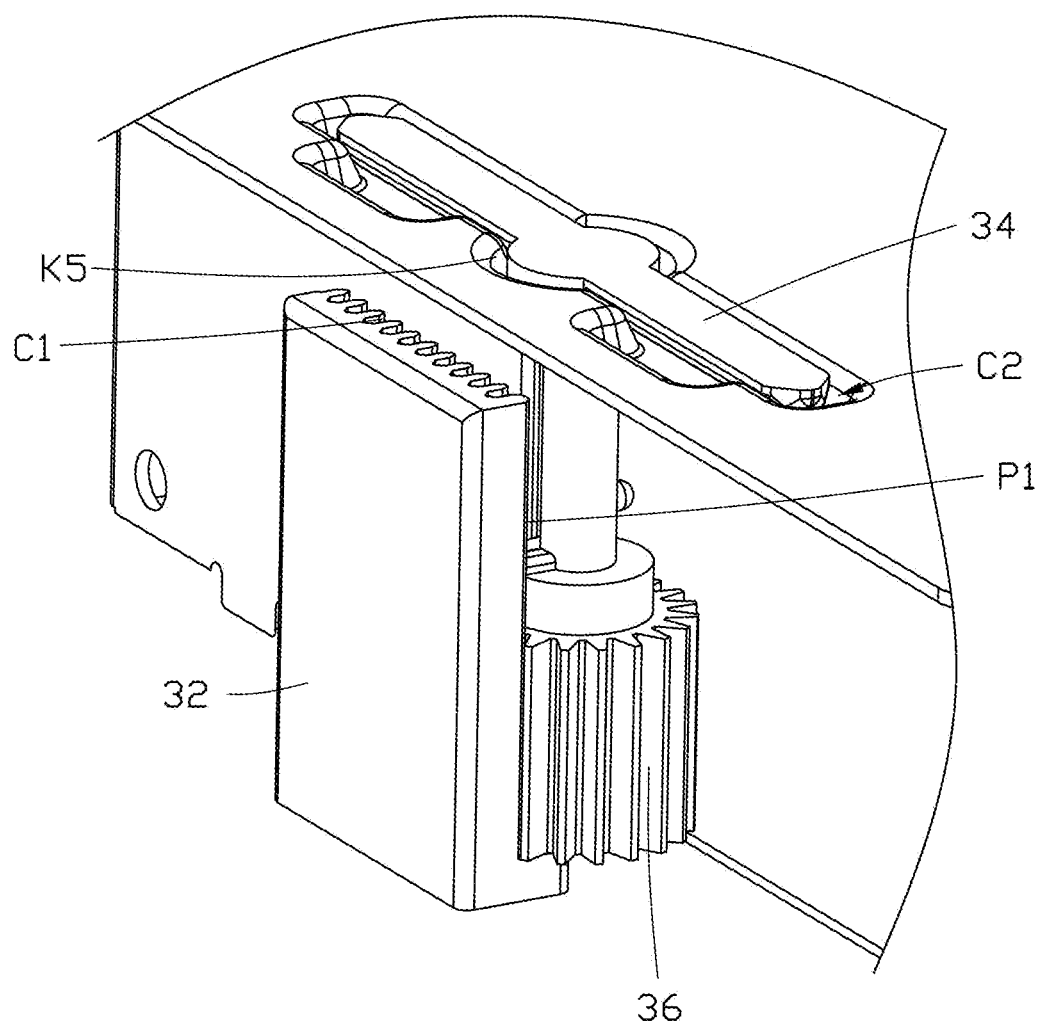
FIG. 7 is a schematic diagram illustrating a handle unit and a support plate according to the embodiment of the present disclosure.

Referring to FIGS. 4-6, the fan unit 12 includes a mounting plate 15 and a plurality of fan sections 16, the plurality of fan sections 16 is spaced from each other along the third direction X and slidably coupled to the mounting plate 15, respectively, along a second direction Y. The mounting plate 15 is removably coupled to the housing 11 and covers the first opening K1 (see FIG. 1).

Figure 8:
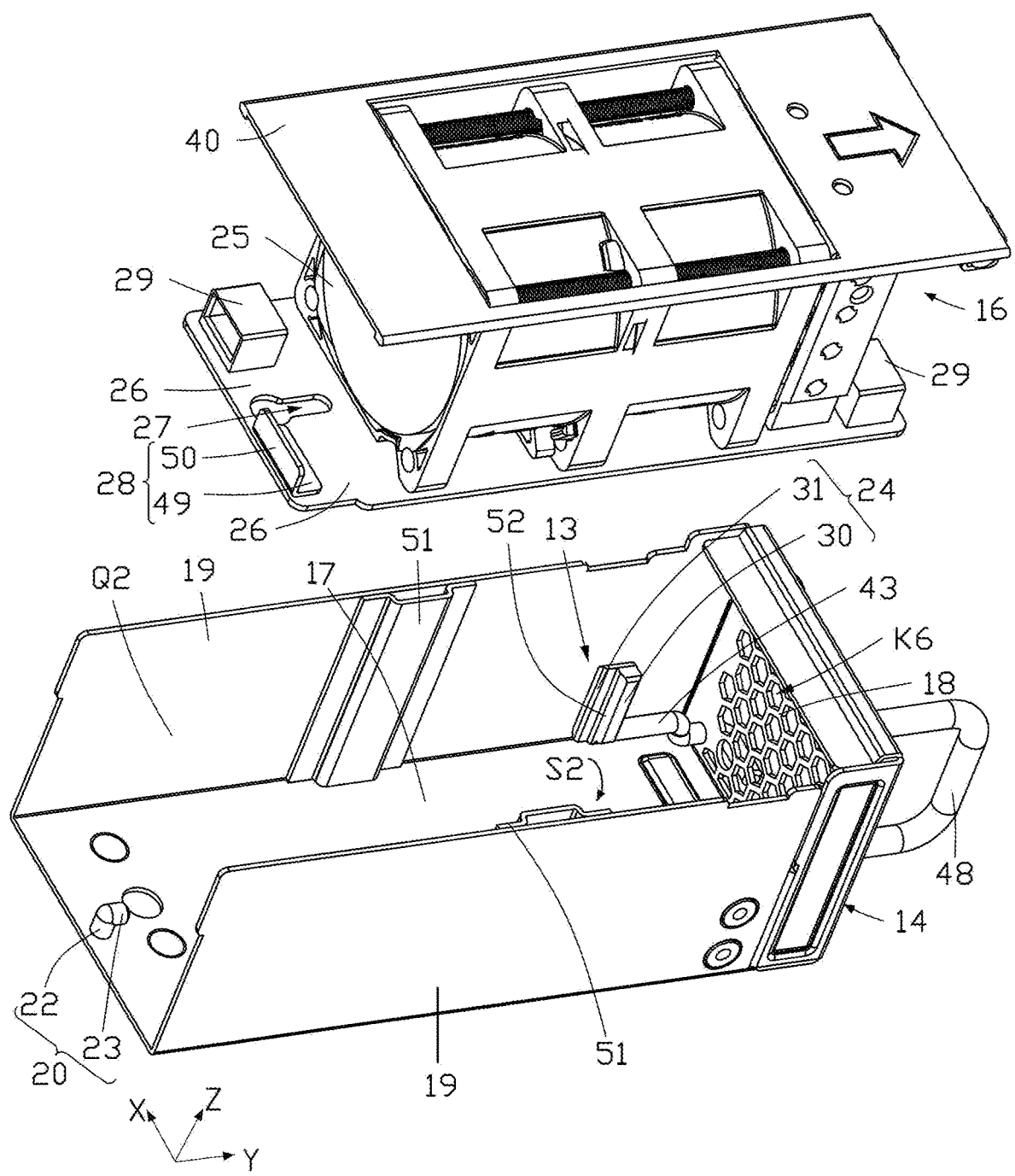
FIG. 8 is a three-dimensional view illustrating a bracket and a fan section taken out from the bracket according to the embodiment of the present disclosure.
Figure 9:
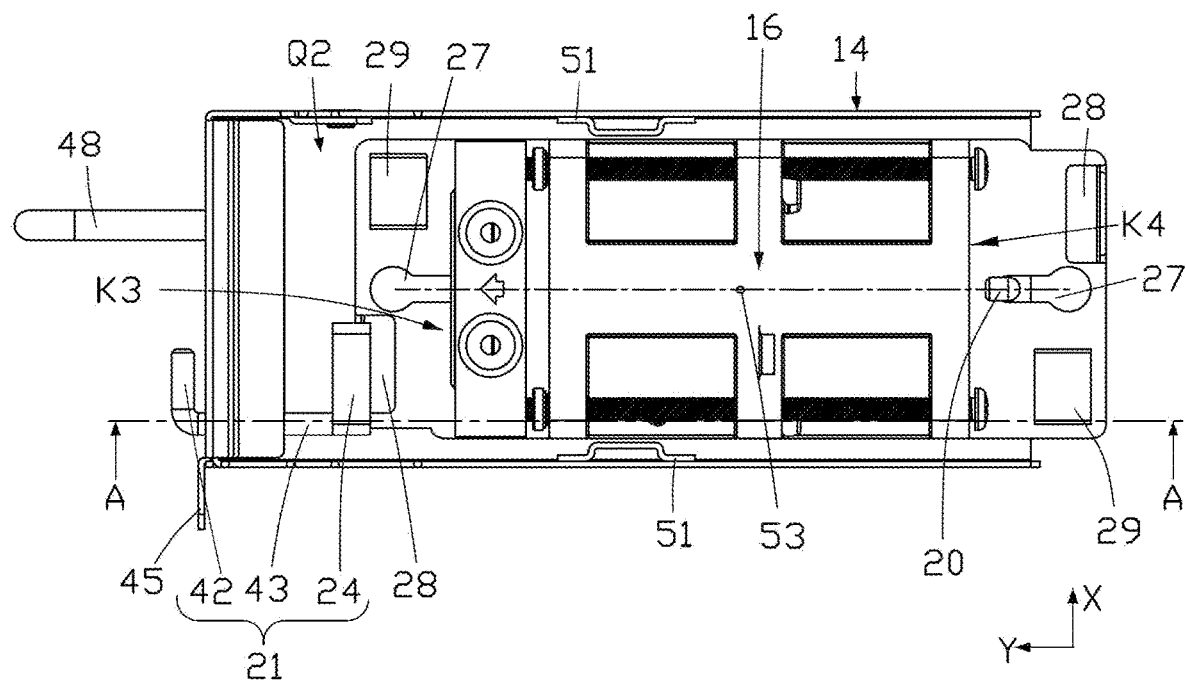
FIG. 9 is a top view illustrating the bracket and the fan section fitted in the bracket without showing a sliding plate of the fan section according to the embodiment of the present disclosure.
Figure 10:
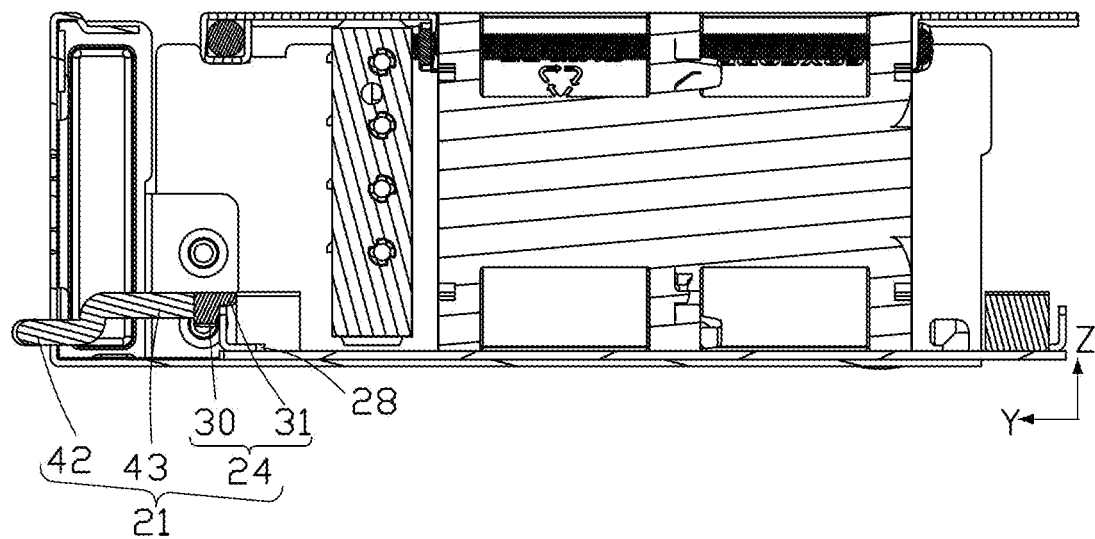
FIG. 10 is a cross-sectional view illustrating the bracket and the fan section in FIG. 9 along line A-A.
Figure 11:
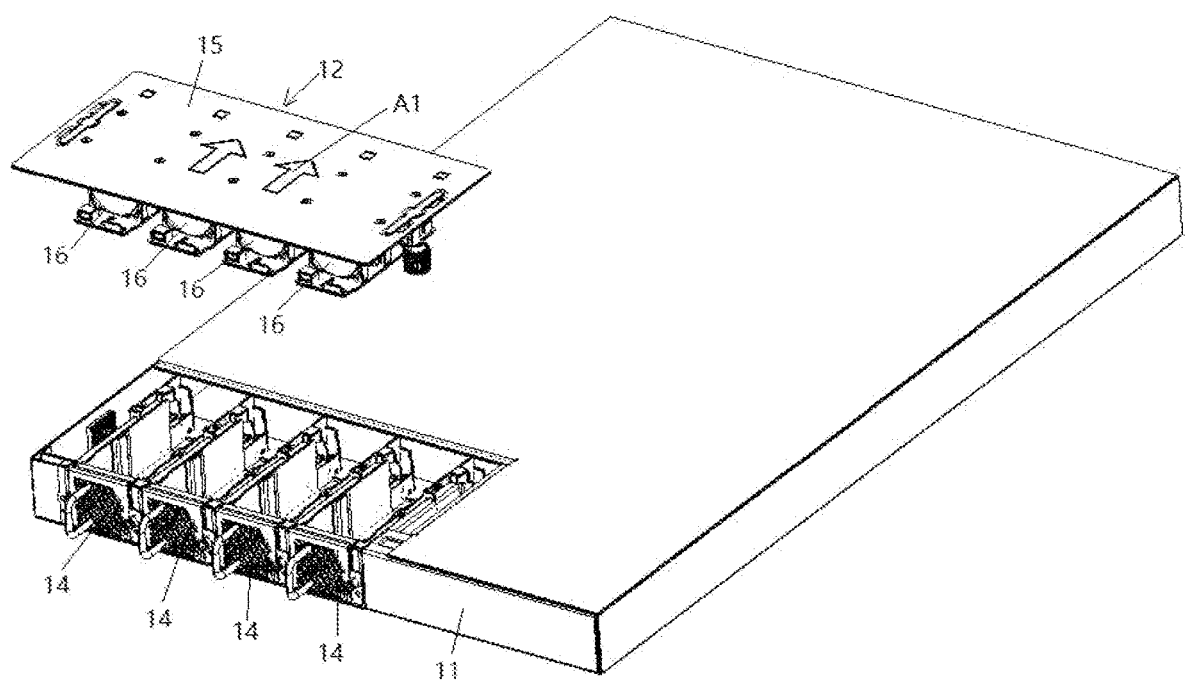
FIG. 11 is an exploded view illustrating the fan unit is taken out from a housing and the brackets of the electronic device in FIG. 1 and rotated clockwise by 180°.

Referring to FIGS. 8-10, the bracket 14 is provided with a fan mounting chamber Q2, the fan mounting chamber Q2 is oriented towards a side of the first opening K1 (see FIG. 10, where a top of the bracket 14 is not closed to form an opening) to allow the fan section 16 to be disposed into the fan mounting chamber Q2 along the first direction Z. The plurality of fan sections 16 fits one-to-one into the fan mounting chambers Q2 of the plurality of brackets 14 along the first direction Z; the fan section 16 has an air inlet K3 and an air outlet K4 opposite the air inlet along the second direction Y. The fan unit 12 is capable of being rotated as a whole to adjust the fan sections 16 a state that the air inlet K3 is close to the second opening K2 or another state that the air outlet K4 is close to the second opening K2.

The locking mechanism 13 is used to lock the fan section 16 to the bracket 14 so that the fan section 16 locked to the bracket 14 can be slid out of the receiving chamber Q1 with the bracket 14. Moreover, the locking mechanism 13 can be unlocked so that the fan section 16 slid out of the receiving chamber Q1 with the bracket 14 can be removed in a state in which the fan section 16 is unlocked from the bracket 14 and be steered to a state in which the air inlet K3 or the air outlet K4 corresponds to the second opening K2.

In the embodiment, the bracket 14 includes a support plate 17, an end plate 18, and two side plates 19, the two side plates 19 are attached to both sides of the support plate 17 in a wide direction (i.e. the third direction X), a lower end of the end plate 18 is attached to the support plate 17, and the end plate 18 is attached to both sides of the end plate 18, and the support plate 17, the end plate 18 and the two side plates 19 enclose the fan mounting chamber Q2, the fan mounting chamber Q2 opens towards the first direction Z. Optionally, the end plate 18 corresponds to the second opening K2 to cover the second opening K2 (see FIG. 1), and the end plate 18 is provided with an air hole K6. Depending on mounting direction of the fan section 16, the air holes K6 may correspond to the inlet opening K3 or the outlet opening K4 of the fan section 16 for the passage of airflow. The air hole K6 may include a plurality of small holes distributed on the end plates 18, which may be in the form of a honeycomb or other shapes, and are not limited herein. Optionally, two guide plates 51 extending along the first direction Z are attached to inner sides of the two side plates 19 at a middle position of inner sides in a long direction (i.e. the second direction Y) respectively, and a distance between the two guide plates 51 is approximately equal to a width of the fan section 16, so that the fan section 16 may be guided to mount into the fan mounting chamber Q2 along the first direction Z.

The locking mechanism 13 includes a hook 20 and a blocking member 21 spaced from the hook 20 along the second direction Y. The hook 20 and the blocking member 21 are connected to the bracket 14. The hook 20 is connected to a side of the support plate 17 away from the end plate 18. The hook 20 includes a vertical extension section 22 vertically connected to the support plate 17, and a horizontal extension section 23 connected to an end portion of the vertical extension section 22 and the horizontal extension section 23 extends along the second direction Y. The blocking member 21 is rotatably connected to the end plate 18, and the blocking member 21 includes a blocking block 24 and the blocking block 24 is in the fan mounting chamber Q2.

In the embodiment, the fan section 16 includes a fan 25 and an adapter plate 26, the adapter plate 26 is provided with two receiving holes 27 spaced along the second direction Y. The two receiving holes 27 are centrosymmetric with respect to a center point 53 of the adapter plate 26 to ensure that the two receiving holes 27 switch places with each other after the adapter plate 26 is rotated by 180°. The receiving hole 27 is extended along the second direction Y, and may be provided with a flared hole enlarged at one end to facilitate entry of the hook 20. The adapter plate 26 is provided with two limit blocks 28, and the two limit blocks 28 are provided at two ends of the adapter plate 26 along the second direction Y and are centrosymmetric with respect to the center point 53 of the adapter plate 26 to ensure that after the adapter plate 26 is rotated by 180°, the positions of the two limit blocks 28 are switched. In a state where the fan section 16 is mated in the fan mounting chamber Q2, the hook 20 passes through one of the receiving holes 27, the blocking block 24 is abutted against one of the limit blocks 28 along the second direction Y, and the horizontal extension section 23 is made to block a region of the adapter plate 26 at the periphery of the receiving hole 27 to block the adapter plate 26 from disengaging relative to the support plate 17 along the first direction Z. The blocking member 21 is capable of rotating until the blocking block 24 leaves the limit block 28 to allow the adapter plate 26 to move relative to the support plate 17 along the second direction Y to a position where the horizontal extension section 23 corresponds exactly to the receiving hole 27, which in turn allows the fan section 16 to be dislodged from the bracket 14 along the first direction Z.

In the embodiment, the fan section 16 further includes two fan connectors 29, and the fan section 16 is energized when any one of the two fan connectors 29 is electrically energized, for example, connected to a power supply. The two fan connectors 29 are disposed at each end of the adapter plate 26 along the second direction Y and are centrosymmetric with respect to the center point 53 of the adapter plate 26 to ensure that the two fan connectors 29 are in the right position after the adapter plate 26 is rotated by 180°. In this way, one of the two fan connectors 29 is available for the fan section 16 to be connected to the power supply whether the fan section 16 is in a state of forward air outlet or a state of reverse air outlet.

The blocking block 24 includes a side block 30 and a top block 31 mutually perpendicular to each other, the side block 30 is for abutting the limit block 28 along the second direction Y, and the top block 31 is for abutting the limit block 28 along the first direction Z. By abutting the limit block 28 both along the second direction Y and the first direction Z, the fan section 16 may be stably restrained on the bracket 14. Optionally, the side block 30 is provided with a chamfer 52 on a side away from the top block 31 so that the side block 30 can be guided to gradually press against the limit block 28 along the second direction Y during the rotation of the blocking block 24 to press down the limit block 28.

The blocking member 21 further includes a rotation handle 42 and a shaft section 43, the shaft section 43 passes through the end plate 18 and the shaft section 43 is rotatably connected to the end plate 18. The shaft section 43 is connected to the blocking block 24 at one end and to the rotation handle 42 at another end, the rotation handle 42 is located outside of the fan mounting chamber Q2. In this way, a user can rotate the blocking block 24 by rotating the rotation handle 42 to make the blocking block 24 abutting against or moving away from the limit block 28.

In other embodiments, the blocking member 21 may also be provided in other forms, for example, the blocking member 21 may adopt a translational movement instead of a rotational movement. The blocking member 21 may also be provided as a structure with a self-locking function to enable self-locking when the blocking member 21 locks the limit block 28.

In other embodiments, it is also possible to omit the limit block 28 and limit the fan section 16 by mutual limitation of the blocking member 21 and the fan 25, the adapter plate 26 or other components of the fan section 16.

Optionally, the limit block 28 is L-shaped and includes a horizontal plate 49 and a vertical plate 50 vertically connected to each other. The horizontal plate 49 is stacked and fixed to the adapter plate 26, and the vertical plate 50 extends vertically from the adapter plate 26 for mutual limiting with the blocking block 24.

Referring to FIGS. 9 and 3, the bracket 14 has a connecting lug 45, the connecting lug 45 is used to be locked to the partition plate 44 by a locking member 46 (e.g., a screw) when the bracket 14 fits within the slide space Q3. In this way, the bracket 14 may be locked to the partition plate 44 by the locking member 46. When it is necessary to extract one of the brackets 14, the locking member 46 is loosened and the bracket 14 may be removed from the slide space Q3, while the other brackets 14 remain locked to the partition plate 44.

In other embodiments, the connecting lug 45 may also be locked to the housing 11 or other locations.

In other embodiments, the connecting lug 45 may also be omitted and the bracket 14 is locked by other means.

Referring to FIG. 2 and FIGS. 4-7, in the embodiment, the fan assembly 10 further comprises two bear plates 32, the two bear plates 32 are provided on each side along the third direction X of the receiving chamber Q1, and each of the two bear plates 32 is provided with a rack bar surface P1 of two rack bar surfaces P1, the two rack bar surfaces P1 are opposite to each other, the rack bar surface P1 is extended along the second direction Y, and a tooth groove C1 of the rack bar surface P1 runs through the bear plate 32 along the first direction Z. The mounting plate 17 is provided with two handle grooves C2 on a side away from the fan section 16, and bottom surface of each of the handle grooves C2 is provided with a via hole K5 through the mounting plate 17; the fan unit 12 further includes two handle units 33, the two handle units 33 are connected to the mounting plate 17, a handle unit 33 of the two handle units 33 includes a handle rod 34, a connecting rod 35 and a displacement gear 36. The connecting rod 35 passes through the via hole K5, and an end of the connecting rod 35 away from the fan section 16 is connected to the handle rod 34, and another end of the connecting rod 35 is connected to the displacement gear 36, so that a force applied to the handle rod 34 may move the handle unit 33 in an axial direction of the connecting rod 35 or rotate the handle unit 33 with respect to the connecting rod 35. The displacement gear 36 meshes with the rack bar surface so that rotation of the displacement gear 36 drives the fan unit 12 to move along the second direction Y relative to the housing 11, so that the adapter plate 15 moves relative to the hoop 20 to a position where the horizontal extension section 23 blocks the adapter plate 15 or move to exit from the position. The displacement gear 36 is opposite to the mounting plate 17 on a side near the fan section 16, and the displacement gear 36 has a cross-sectional dimension larger than the via hole K5, so that lifting the handle rod 34 can drive the displacement gear 36 to support the mounting plate 17 axially for lifting or lowering the fan unit 12.

A plurality of guide rails 37 is provided and connected to a surface of the mounting plate 15, each of the plurality of guide rails 37 extends along the second direction Y, and the plurality of guide rails 37 is spaced from each other in sequence along the third direction X; a first magnetic member 38 is provided on the mounting plate 15 beside each of the plurality of guide rails 37.

The fan section 16 further includes a sliding plate 40 connected to the fan 25. In this manner, the fan section 16 in this embodiment broadly includes the fan 25 located in the middle, and the sliding plate 40 and the adapter plate 26 connected to both sides of the fan 25 in the thickness direction, respectively. The fan 25 may generate an airflow when energized, the sliding plate 40 may form a sliding fit with the guide rail 37 on the mounting plate 15, and the adapter plate 26 may be locked to the bracket 14 by the locking mechanism 13.

The sliding plate 40 is provided with at least one second magnetic member 41. The sliding plate 40 is slidably connected to the guide rail 37, the first magnetic member 38 is configured to magnetically attract the second magnetic member 41 to magnetically connect the sliding plate 40 to the mounting plate 15. The guide rail 37 passes through along the second direction Y, so that the fan section 16, which is locked to the bracket 14, may slide out of the guide rail 37 along with the bracket 14 along the second direction Y to disengage from the mounting plate 15 when the bracket 14 slides out along the second direction Y in relation to the housing 11. In the embodiment, each sliding plate 40 is provided with two second magnetic members 41 on each side along a width direction of the sliding plate 40, and each of the two second magnetic members 41 may be suctioned to a first magnetic member 38 nearby.

In other embodiments, the number of the first magnetic members 38 and the second magnetic members 41 may also be set as desired, and is not limited herein.

The method of using the electronic device 100 in the embodiment will be describes as follow.

In an initial state, the installation state of the fan assembly 10 is shown in FIG. 1. At this time, the direction of the airflow of the fan section 16 is as shown by a hollow arrow A1 marked on the mounting plate 15 in FIG. 1.

When it is necessary to switch airflow direction of all the fan sections 16, in a first step, the blocking member 21 on each of the brackets 14 is rotated to release the displacement restriction of the blocking block 24 to the limit block 28 on the fan sections 16 along the second direction Y by a user. In a second step, both hands of the user withdraw the two handle units 33 from the fan unit 12 respectively, and during the withdrawing, the displacement gear 36 slips in the axial direction with respect to the toothed groove C1 and remains meshed with the displacement gear 36. In a third step, rotate the handle rod 34 to rotate the displacement gear 36, and due to the mesh fit between the displacement gear 36 and the bear plate 32, in a state where the bear plate 32 is fixed to the housing 11, the rotation of the displacement gear 36 with respect to the bear plate 32 will cause the displacement gear 36 to be displaced along the direction of the extension of the rack face P1 (i.e. the second direction Y), which will cause the entire handle unit 33 and even the entire fan unit 12 to move along the second direction Y relative to the housing 11, the movement of the fan unit 12 causes the hook 20 to correspond to the receiving hole 27 along the first direction Z, thereby releasing the restriction of the horizontal extension section 23 of the hook 20 on the displacement of the adapter plate 26 along the first direction Z. In a fourth step, the handle units 33 is continued to be lifted and pulled along the first direction Z, and the fan unit 12 is driven out of the housing 11 and each bracket 14. In a fifth step, rotate the entire fan unit 12 horizontally by 180° to a state in FIG. 11, and then reassemble the fan unit 12 into the housing 11 and the brackets 14, and then reverse the operation in accordance with the preceding steps to re-achieve the restriction of the horizontal extension section 23 of the hook 20 on the adapter plate 26 along the first direction Z, and the restriction of the limit block 28 by the blocking member 21 along the second direction Y. At this time, the directions of the air inlet K3 and the air outlet K4 of each fan section 16 of the fan unit 12 are switched, and the direction of the airflow of the fan unit 12 is changed to the direction illustrated by the hollow arrow A1 on the mounting plate 15 in FIG. 11.

This switching method, which can realize the switching of the airflow direction of all the fan sections 16 at one time, is highly efficient and can realize tool-less operation, which is easy to use.

Figure 12:
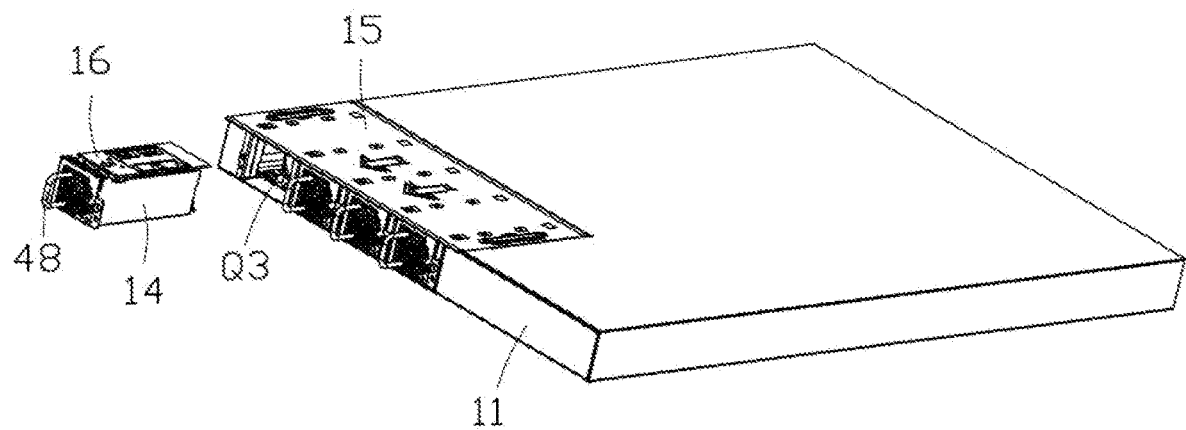
FIG. 12 is an exploded view illustrating one bracket and one fan section of the electronic device is taken out from the electronic device in FIG. 1.

When a single fan section 16 is needed to be removed and replaced, the locking member 46 at the connecting lug 45 is first to be loosened, and the handle member 48 connected to the end plate 18 of the bracket 14 is drawn along the second direction Y, and the bracket 14 and the fan section 16 locked to the bracket 14 can be drawn out together, then the fan section 16 can be removed and replaced. This state is shown in FIG. 12. It should be noted that in the process of withdrawing the bracket 14, it is necessary to overcome the magnetic force between the first magnetic member 38 and the second magnetic member 41. And in the process of withdrawing the bracket 14, the sliding plate 40 of the fan section 16 is guided by the guide rail 37 on the mounting plate 15.

Above all, the electronic device 100 in the embodiment of the disclosure only needs to be configured with one fan unit 12 to realize the cooling of bidirectional airflow, which reduces the material management requirements and the occupation of material storage space. Moreover, for the electronic device 100, the direction of the airflow of the entire fan unit 12 can be easily changed as a whole, and each of the plurality of fan sections can easily be removed and replaced, which is simple in structure and easy to use.

The above implementation methods are only used to illustrate the technical solution of this application and not to limit it. Although the application has been described in detail with reference to the preferred implementation methods mentioned above, ordinary technical personnel in the art should understand that modifications or equivalent replacements to the technical solution of this application should not deviate from the spirit and scope of the technical solution of this application.

What is claimed is:

1. A fan assembly for mounting in a housing of an electronic device, the housing is provided with a receiving chamber, a first opening, and a second opening, the first opening is oriented towards a first direction, the second opening is oriented towards a second direction, the first opening is communicated to the receiving chamber, the second opening is communicated to the receiving chamber, the first direction is perpendicular to the second direction, the fan assembly comprising:
a plurality of brackets, wherein the plurality of brackets is spaced in a third direction, the third direction is perpendicular to the first direction and the second direction, each of the plurality of brackets is slidably connected to the housing along the second direction and each of the plurality of brackets is configured to slide in or out of the receiving chamber through the second opening, each of the plurality of brackets is provided with a fan mounting chamber, the fan mounting chamber is oriented towards the first opening;
a fan unit comprising a mounting plate and a plurality of fan sections, wherein the mounting plate is removably connected to the housing and the mounting plate covers the first opening, the plurality of fan sections is spaced from each other along the third direction and each of the plurality of fan sections is slidably connected to the mounting plate along the second direction, each of the plurality of fan sections is received in a corresponding fan mounting chamber along the first direction, and has an air inlet and an air outlet opposite the air inlet along the second direction, the fan unit is configured for being rotated integrally to switch between a first state and a second state, in the first state, the air inlet is faced towards the second opening, and in the second state, the air outlet is faced towards the second opening; and
a plurality of locking mechanisms, wherein each of the plurality of locking mechanisms is configured for locking each of the plurality of fan sections to a corresponding bracket, each of the plurality of fan sections locked to each of the plurality of brackets is slidable out of the receiving chamber with the corresponding bracket, and each of the plurality of fan sections sliding out of the receiving chamber with the corresponding bracket is configured for being taken away from the corresponding brackets after each of the plurality of fan sections is unlocked and the fan section unlocked is switchable to the first state or the second state.

2. The fan assembly as claimed in claim 1, wherein each of the plurality of brackets comprises a support plate, an end plate, and two side plates, the two side plates are connected to two sides of the support plate along a width thereof, a lower end of the end plate is connected to the support plate, and two sides of the end plate are connected to the two side plates, the support plate, the end plate, and the two side plates encircle the fan mounting chamber,
each of the plurality of locking mechanisms comprises a hook and a blocking member, the hook and the blocking member are attached to the corresponding bracket, and the hook and the blocking member are spaced from each other along the second direction,
the hook is connected to the corresponding bracket on a side away from the end plate of the corresponding bracket, the hook comprises a vertical extension section and a horizontal extension section, the vertical extension section is vertically connected to the corresponding bracket, the horizontal extension section is connected to an end of the vertical extension section, and the horizontal extension section is extended along the second direction,
the blocking member is rotatably connected to the end plate, the blocking member comprises a blocking block, the blocking block extends into the fan mounting chamber,
each of the plurality of fan sections comprises a fan and an adapter plate, the adapter plate is provided with two receiving holes, the two receiving holes are spaced along the second direction, the two receiving holes are centrosymmetric with respect to a center point of the adapter plate, each of the two receiving holes extends along the second direction,
the adapter plate is provided with two limit blocks, the two limit blocks are disposed at two ends of the adapter plate along the second direction and the two limit blocks are centrosymmetric with respect to the center point of the adapter plate, when each of the plurality of fan sections is received in a corresponding fan mounting chamber, the hook passes through one of the two receiving holes and the blocking member presses against one of the two limit blocks along the second direction and the horizontal extension section blocks the adapter plate in an area peripheral to the receiving hole to avoid the adapter plate dislodged away from the support plate along the first direction, and the blocking member is rotatable to make the blocking block be departed from the limiting block, and the adapter plate is movable along the second direction to a place where the horizontal extension section corresponds to one of the two receiving holes, thereby allowing the fan unit to be dislodged from the support plate along the first direction.

3. The fan assembly as claimed in claim 2, wherein each of the plurality of fan sections further comprises two fan connectors, each of the plurality of fan sections is energized when either one of the two fan connectors is electrically energized, and the two fan connectors are disposed at two ends of the adapter plate along the second direction and the two fan connectors are centrosymmetric with regard to the center point of the adapter plate.

4. The fan assembly as claimed in claim 2, wherein the blocking block comprises a side block and a top block, the side block is perpendicular to the top block, the side block is configured to abut against the one of the two limit blocks along the second direction, and the top block is configured to abut against the one of the two limit blocks along the first direction.

5. The fan assembly as claimed in claim 2, further comprising two bear plates, wherein the two bear plates are provided on two sides of the receiving chamber along the third direction, and each of the two bear plates is provided with a rack bar surface, the rack bar surfaces are opposite to and spaced from each other, the rack bar surface is extended along the second direction, the rack bar surface defines a plurality of tooth grooves and the plurality of tooth grooves of the rack bar surface runs through the support plate along the first direction, the mounting plate is provided with two handle grooves on a side away from the plurality of fan sections, and a bottom surface of each of the two handle grooves is provided with a via hole through the mounting plate, the fan unit further comprises two handle units, the two handle units are connected to the mounting plate, each of the two handle units comprises a handle rod, a connecting rod, and a displacement gear, the connecting rod passes through the via hole, and one end of the connecting rod away from the plurality of fan sections is connected to the handle rod, and another end of the connecting rod is connected to the displacement gear, so that a force applied to the handle rod moves a corresponding handle unit in an axial direction of the connecting rod or rotates the corresponding handle unit with regard to the connecting rod, the displacement gear meshes with the rack bar surface to drive the fan unit to move along the second direction relative to the housing, the adapter plate moves relative to the hook to a position where the horizontal extension section blocks the adapter plate or move to exit from the position, and the displacement gear is disposed opposite to a side of the mounting plate near the plurality of fan sections, and the displacement gear has a cross-sectional dimension larger than the via hole, so that lifting the handle rod drives the displacement gear to support the mounting plate axially for lifting or lowering the fan unit.

6. The fan assembly as claimed in claim 2, wherein a plurality of guide rails is provided and connected to a surface of the mounting plate, each of the plurality of guide rails extends along the second direction, and the plurality of guide rails is spaced from each other along the third direction, each of a plurality of first magnetic members is provided on the mounting plate and beside each of the plurality of guide rails, each of the plurality of fan sections comprises a fan and a sliding plate, the sliding plate is provided with a second magnetic member, the sliding plate is slidably connected to a corresponding guide rail, and a corresponding first magnetic member is configured to magnetically attracted to the second magnetic member to magnetically connect the sliding plate to the mounting plate, and the sliding plate is configured to slide out from the corresponding guide rail to be moved away with the corresponding bracket from the housing.

7. The fan assembly as claimed in claim 1, wherein the receiving chamber is provided with a plurality of partition plates, the plurality of partition plates is spaced from each other sequentially along the third direction, each of the plurality of partition plates is connected to the housing, and a plurality of slide spaces is defined between each two adjacent partition plates of the plurality of partition plates, and each of the plurality of brackets is slidably disposed in each of the plurality of slide spaces along the second direction.

8. The fan assembly as claimed in claim 7, wherein each of the plurality of brackets comprises a connecting lug, the connecting lug is configured for being locked to a corresponding partition plate or the housing by a locking member when the corresponding bracket is coupled in a corresponding slide space.

9. The fan assembly as claimed in claim 2, wherein the end plate covers the second opening, the end plate is provided with an air hole, the air hole is opposite to the air inlet or the air outlet.

10. An electronic device, comprising:

a housing, wherein the housing has a receiving chamber, a first opening, and a second opening, the first opening is oriented towards a first direction, the second opening is oriented towards a second direction, the first opening is communicated to the receiving chamber, the second opening is communicated to the receiving chamber, the first direction is perpendicular to the second direction; and a fan assembly mounted in the housing comprising:

a plurality of brackets, wherein the plurality of brackets is spaced in a third direction, the third direction is perpendicular to the first direction and the second direction, each of the plurality of brackets is slidably connected to the housing along the second direction and each of the plurality of brackets is configured to slide in or out of the receiving chamber through the second opening, each of the plurality of brackets is provided with a fan mounting chamber, the fan mounting chamber is oriented towards the first opening;

a fan unit comprising a mounting plate and a plurality of fan sections, wherein the mounting plate is removably connected to the housing and the mounting plate covers the first opening, the plurality of fan sections is spaced from each other along the third direction and each of the plurality of fan sections is slidably connected to the mounting plate along the second direction, each of the plurality of fan sections is received in a corresponding fan mounting chamber along the first direction, and has an air inlet and an air outlet opposite the air inlet along the second direction, the fan unit is configured for being rotated integrally to switch between a first state and a second state, in the first state, the air inlet is faced towards the second opening, and in the second state, the air outlet is faced towards the second opening; and a plurality of locking mechanisms, wherein each of the plurality of locking mechanisms is configured for locking each of the plurality of fan sections to a corresponding bracket, each of the plurality of fan sections locked to each of the plurality of brackets is slidable out of the receiving chamber with the corresponding bracket, and each of the plurality of fan sections sliding out of the receiving chamber with the corresponding bracket is configured for being taken away from the corresponding brackets after each of the plurality of fan sections is unlocked and the fan section unlocked is switchable to the first state or the second state.

11. The electronic device as claimed in claim 10, wherein each of the plurality of brackets comprises a support plate, an end plate, and two side plates, the two side plates are connected to two sides of the support plate along a width thereof, a lower end of the end plate is connected to the support plate, and two sides of the end plate are connected to the two side plates, the support plate, the end plate, and the two side plates encircle the fan mounting chamber, each of the plurality of locking mechanisms comprises a hook and a blocking member, the hook and the blocking member are attached to the corresponding bracket, and the hook and the blocking member are spaced from each other along the second direction, the hook is connected to the corresponding bracket on a side away from the end plate of the corresponding bracket, the hook comprises a vertical extension section and a horizontal extension section, the vertical extension section is vertically connected to the corresponding bracket, the horizontal extension section is connected to an end of the vertical extension section, and the horizontal extension section is extended along the second direction, the blocking member is rotatably connected to the end plate, the blocking member comprises a blocking block, the blocking block extends into the fan mounting chamber, each of the plurality of fan sections comprises a fan and an adapter plate, the adapter plate is provided with two receiving holes, the two receiving holes are spaced along the second direction, the two receiving holes are centrosymmetric with respect to a center point of the adapter plate, each of the two receiving holes extends along the second direction, the adapter plate is provided with two limit blocks, the two limit blocks are disposed at two ends of the adapter plate along the second direction and the two limit blocks are centrosymmetric with respect to the center point of the adapter plate, when each of the plurality of fan sections is received in a corresponding fan mounting chamber, the hook passes through one of the two receiving holes and the blocking member presses against one of the two limit blocks along the second direction and the horizontal extension section blocks the adapter plate in an area peripheral to the receiving hole to avoid the adapter plate dislodged away from the support plate along the first direction, and the blocking member is rotatable to make the blocking block be departed from the limiting block, and the adapter plate is movable along the second direction to a place where the horizontal extension section corresponds to one of the two receiving holes, thereby allowing the fan unit to be dislodged from the support plate along the first direction.

12. The electronic device as claimed in claim 11, wherein each of the plurality of fan sections further comprises two fan connectors, each of the plurality of fan sections is energized when either one of the two fan connectors is electrically energized, and the two fan connectors are disposed at two ends of the adapter plate along the second direction and the two fan connectors are centrosymmetric with regard to the center point of the adapter plate.

13. The electronic device as claimed in claim 11, wherein the blocking block comprises a side block and a top block, the side block is perpendicular to the top block, the side block is configured to abut against the one of the two limit blocks along the second direction, and the top block is configured to abut against the one of the two limit blocks along the first direction.

14. The electronic device as claimed in claim 11, further comprising two bear plates, wherein the two bear plates are provided on two sides of the receiving chamber along the third direction, and each of the two bear plates is provided with a rack bar surface, the rack bar surfaces are opposite to and spaced from each other, the rack bar surface is extended along the second direction, the rack bar surface defines a plurality of tooth grooves and the plurality of tooth grooves of the rack bar surface runs through the support plate along the first direction, the mounting plate is provided with two handle grooves on a side away from the plurality of fan sections, and a bottom surface of each of the two handle grooves is provided with a via hole through the mounting plate, the fan unit further comprises two handle units, the two handle units are connected to the mounting plate, each of the two handle units comprises a handle rod, a connecting rod, and a displacement gear, the connecting rod passes through the via hole, and one end of the connecting rod away from the plurality of fan sections is connected to the handle rod, and another end of the connecting rod is connected to the displacement gear, so that a force applied to the handle rod moves a corresponding handle unit in an axial direction of the connecting rod or rotates the corresponding handle unit with regard to the connecting rod, the displacement gear meshes with the rack bar surface to drive the fan unit to move along the second direction relative to the housing, the adapter plate moves relative to the hook to a position where the horizontal extension section blocks the adapter plate or move to away from the position, and the displacement gear is disposed opposite to a side of the mounting plate near the plurality of fan sections, and the displacement gear has a cross-sectional dimension larger than the via hole, so that lifting the handle rod drives the displacement gear to support the mounting plate axially for lifting or lowering the fan unit.

15. The electronic device as claimed in claim 11, wherein a plurality of guide rails is provided and connected to a surface of the mounting plate, each of the plurality of guide rails extends along the second direction, and the plurality of guide rails is spaced from each other along the third direction, each of a plurality of first magnetic members is provided on the mounting plate and beside each of the plurality of guide rails, each of the plurality of fan sections comprises a fan and a sliding plate, the sliding plate is provided with a second magnetic member, the sliding plate is slidably connected to a corresponding guide rail, and a corresponding first magnetic member is configured to magnetically attracted to the second magnetic member to magnetically connect the sliding plate to the mounting plate, and the sliding plate is configured to slide out from the corresponding guide rail to be moved away with the corresponding bracket from the housing.

16. The electronic device as claimed in claim 10, wherein the receiving chamber is provided with a plurality of partition plates, the plurality of partition plates is spaced from each other sequentially along the third direction, each of the plurality of partition plates is connected to the housing, and a plurality of slide spaces is defined between each two adjacent partition plates of the plurality of partition plates, and each of the plurality of brackets is slidably disposed in each of the plurality of slide spaces along the second direction.

17. The electronic device as claimed in claim 16, wherein each of the plurality of brackets comprises a connecting lug, the connecting lug is configured for being locked to a corresponding partition plate or the housing by a locking member when the corresponding bracket is coupled in a corresponding slide space.

18. The electronic device as claimed in claim 11, wherein the end plate covers the second opening, the end plate is provided with an air hole, the air hole is opposite to the air inlet or the air outlet.

* * * * *